United States Patent
Liu et al.

(10) Patent No.: US 9,318,579 B2
(45) Date of Patent: Apr. 19, 2016

(54) METHOD FOR MAKING A SEMICONDUCTOR DEVICE WHILE AVOIDING NODULES ON A GATE

(71) Applicants: STMICROELECTRONICS, INC., Coppell, TX (US); GLOBALFOUNDRIES Inc., Grand Cayman (KY); INTERNATIONAL BUSINESS MACHINES CORPORATION, Armonk, NY (US)

(72) Inventors: Qing Liu, Watervliet, NY (US); Ruilong Xie, Schenectady, NY (US); Xiuyu Cai, Niskayuna, NY (US); Kejia Wang, Poughkeepsie, NY (US); Chun-chen Yeh, Clifton Park, NY (US)

(73) Assignees: STMICROELECTRONICS, INC., Coppell, TX (US); GLOBALFOUNDRIES INC, Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 94 days.

(21) Appl. No.: 14/300,506

(22) Filed: Jun. 10, 2014

(65) Prior Publication Data
US 2015/0357441 A1 Dec. 10, 2015

(51) Int. Cl.
*H01L 29/66* (2006.01)
*H01L 29/78* (2006.01)
*H01L 21/28* (2006.01)

(52) U.S. Cl.
CPC .... *H01L 29/66795* (2013.01); *H01L 21/28114* (2013.01); *H01L 29/6656* (2013.01); *H01L 29/66545* (2013.01); *H01L 29/785* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,306,715 B1* | 10/2001 | Chan | H01L 21/28114 257/E21.205 |
| 7,700,425 B2 | 4/2010 | Wagner et al. | |
| 2003/0235943 A1* | 12/2003 | Trivedi | H01L 21/28114 438/197 |
| 2005/0054169 A1* | 3/2005 | Wagner | H01L 29/78618 438/311 |
| 2014/0199845 A1* | 7/2014 | Choi | H01L 29/401 438/696 |

* cited by examiner

*Primary Examiner* — Charles Garber
*Assistant Examiner* — Alia Sabur
(74) *Attorney, Agent, or Firm* — Allen, Dyer, Doppelt, Milbrath & Gilchrist, P.A.

(57) ABSTRACT

A method for making a semiconductor device includes forming laterally spaced-apart semiconductor fins above a substrate, and a gate overlying the semiconductor fins. The gate has a tapered outer surface. A first pair of sidewall spacers is formed adjacent the gate an exposed tapered outer surface is also defined. Portions of the gate are removed at the exposed tapered outer surface to define a recess. A second pair of sidewall spacers is formed covering the first pair of sidewall spacers and the recess. Source/drain regions are formed on the semiconductor fins.

23 Claims, 4 Drawing Sheets

METHOD FOR MAKING A SEMICONDUCTOR DEVICE WHILE AVOIDING NODULES ON A GATE

FIELD OF THE INVENTION

The present invention relates to the field of electronic devices and, more particularly, to semiconductor devices and related methods.

BACKGROUND OF THE INVENTION

Fin-based field effect transistors (FINFETs) are vertical transistor devices in which a semiconductor fin is located on a substrate and is used to define the source, drain, and channel regions of the device. A gate overlies the fin in the channel area, and in some configurations multiple fins may be used to provide a multi-gate transistor architecture. The multiple gates may be controlled by a single gate, where the multiple gate surfaces act electrically as a single gate, or by independent gates.

FINFET devices may provide desired short channel control to enable technology scaling down to 10 nm nodes and beyond. With ever-increasing device integration densities, various challenges may arise with respect to the gate of FINFET semiconductor devices. For example, spurious nodules may form on a gate during the formation of raised source/drain regions.

A gate structure for a semiconductor FINFET device 20 includes a gate 22 comprising polysilicon formed above a gate dielectric layer 24, as illustrated in FIG. 1. To protect the gate 22 during formation of raised source/drain regions 32, a hard mask 26 is formed on an upper surface of the gate 22, and a pair of sidewall spacers 28 is formed on the sidewalls of the polysilicon layer. The pair of sidewall spacers 28 is intended to entirely cover the sidewall surfaces of the gate 22.

Any exposure of the gate 22 through either the hard mask 22 and/or the sidewall spacers 28 during the formation of raised source/drain regions 32 results in unwanted epitaxial growth of silicon nodules 40 on the upper surfaces of the gate where they are exposed. Plasma etching is typically used to form the gate 22. However, when the gate 22 is formed in an open or less dense area on the substrate 30, the plasma etching heats the gate differently as compared to being heated in a confined or more dense area. As a result, the gate 22 may have a tapered profile. Because of the tapered profile, the pair of sidewall spacers 28 may leave part of the gate 22 exposed. This exposure allows for the growth of the silicon nodules 40.

One approach to avoiding the formation of spurious nodules on a gate is disclosed in U.S. Pat. No. 7,700,425 to Wagner et al., which is hereby incorporated herein in its entirety by reference. In Wagner et al, an amorphous silicon cap layer is formed in the top surface of the gate, and a hard mask is formed on top of the cap layer. A notch is formed in the periphery of the cap layer between the gate and the hard mask. The notch is filled with a plug composed of a dielectric material. The plug extends down below the level of the top of the sidewall spacers for the purpose of eliminating exposure of the gate. Nonetheless, other approaches to eliminating the exposure of the gate during formation of raised source/drain regions may be desirable.

SUMMARY OF THE INVENTION

A method for making a semiconductor device may include forming, above a substrate, a plurality of laterally spaced-apart semiconductor fins, and forming a gate overlying the plurality of semiconductor fins and having a tapered outer surface. The method may further include forming a first pair of sidewall spacers adjacent the gate and defining an exposed tapered outer surface. Portions of the gate at the exposed tapered outer surface may be removed to define a recess. The method may further include forming a second pair of sidewall spacers covering the first pair of sidewall spacers and the recess. Source/drain regions may then be formed on the plurality of semiconductor fins.

When the gate is formed having a tapered profile, it becomes difficult for the first pair of sidewall spacers to entirely cover the sidewall surfaces of the gate. By removing portions of the gate at the exposed tapered outer surface to define a recess, this advantageously allows the second pair of sidewall spacers to cover the recess. With the sidewall surfaces of the gate entirely covered, the formation of spurious nodules is avoided during formation of the source/drain regions.

The first pair of sidewall spacers may remain intact while the notch is formed. A mask may be formed on an upper surface of the gate before forming the first pair of sidewall spacers. The mask may also remain intact while the notch is formed.

The source/drain regions may be epitaxially grown. The source/drain regions may comprise epitaxially grown silicon or silicon germanium, for example. The gate may comprise a dummy gate. The substrate may comprise a semiconductor substrate.

A related semiconductor device may include a substrate, a plurality of laterally spaced-apart semiconductor fins above the substrate, and a gate overlying the plurality of semiconductor fins and having a tapered outer surface and with a recess defined therein. A pair of sidewall spacers may cover the gate and the recess. Source/drain regions are on the plurality of semiconductor fins.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring now to FIGS. 2-6, a semiconductor FINFET device 120 and associated method for making the semiconductor device are described. In particular, the semiconductor FINFET device 120 avoids the unwanted formation of spurious nodules on the gates 160(1)-160(3) during formation of the source/drain regions 140.

Semiconductor fins 134 extend between the source/drain regions 140 above a substrate 130, and multiple gates 160(1)-160(3) overlie the semiconductor fins 134, with the gates being perpendicular to a length of the semiconductor fins. The regions of the semiconductor fins 134 that are positioned below the gates 160(1)-160(3) define semiconductor channel regions. The substrate 130 may comprise a semiconductor substrate.

Figure 1:
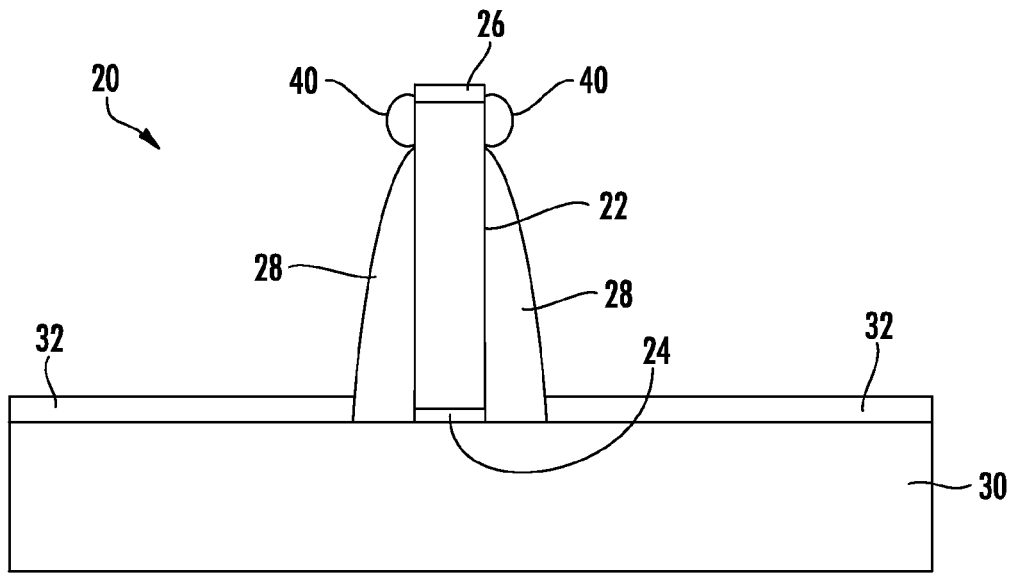
FIG. 1 is a cross-sectional side view of a semiconductor FINFET device with spurious nodules on an exposed surface of the gate in accordance with the prior art.
Figure 2:
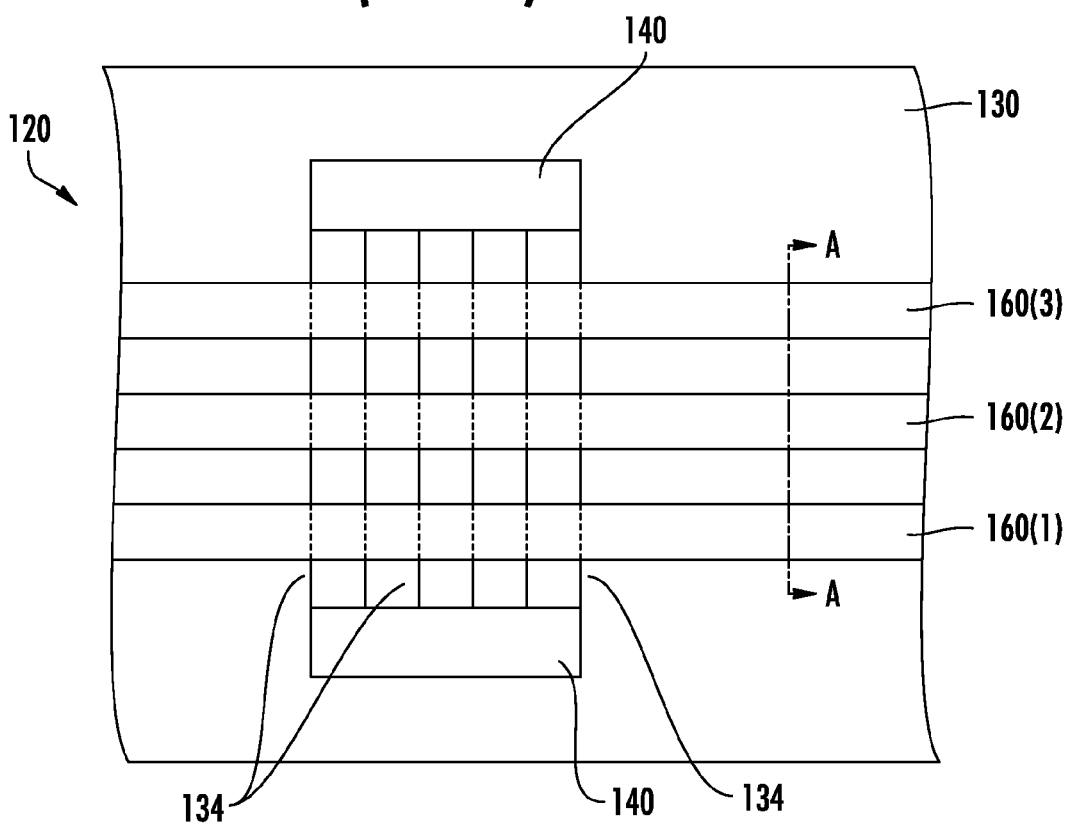
FIG. 2 is a top view of a semiconductor FINFET device without spurious nodules in accordance with the present invention.
Figure 3:
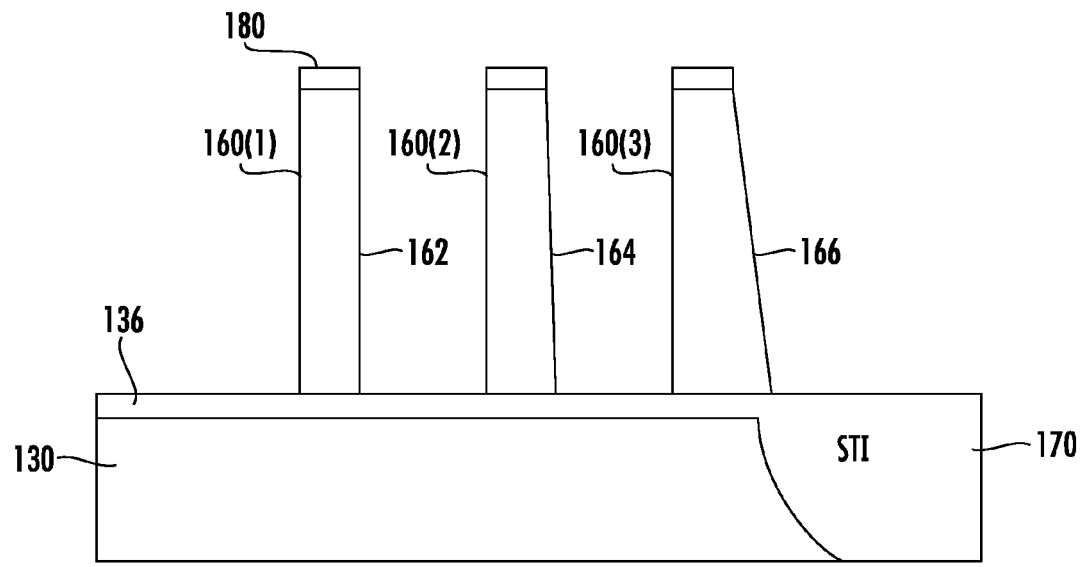
FIGS. 3-6 are a series of cross-sectional views taken along line A-A of FIG. 2 and illustrating a method of making the semiconductor FINFET device shown therein.

The cross-sectional side views in FIGS. 3-6 are taken along line AA' in FIG. 2. A gate patterning/etching step may be performed to define the gates 160(1)-160(3) above a gate dielectric layer 136, as will be appreciated by those skilled in the art. When plasma etching is used to form the gates 160(1)-160(3), the gates may be heated differently depending on their respective locations on the substrate 130. This variation in heat exposure may effect the profile of the gates 160(1)-160(3), as provided in FIG. 3 and as readily appreciated by those skilled in the art.

A first gate 160(1) is formed in a confined or dense area on the substrate 130, and as a result, is exposed to a consistent temperature during plasma etching. The profile of the first gate 160(1) is rectangular in shape and has a vertical outer surface 162.

However, the second and third gates 160(2), 160(3) are formed in an open or less dense area on the substrate 130. The plasma etching heats the second and third gates 160(2), 160(3) differently as compared to the first gate 160(1). This exposure of the second and third gates 160(2), 160(3) to different temperature variations causes the gates to have tapered outer surfaces 164 and 166. With a tapered profile, the width at an upper surface is less than a width at a base of the second and third gates 160(2), 160(3).

The tapered outer surface 164 of the third gate 160(3) has a more tapered profile since it is the last gate and overlies a shallow trench isolation (STI) region 170, for example. The tapered outer surface 164 of the second gate 160(2) has a less tapered profile since it is between adjacent gates 160(1) and 160(3) and is near its line end, for example. After the gates 160(1)-160(3) are formed, a mask 180 is formed on an upper surface of the gates.

Figure 4:
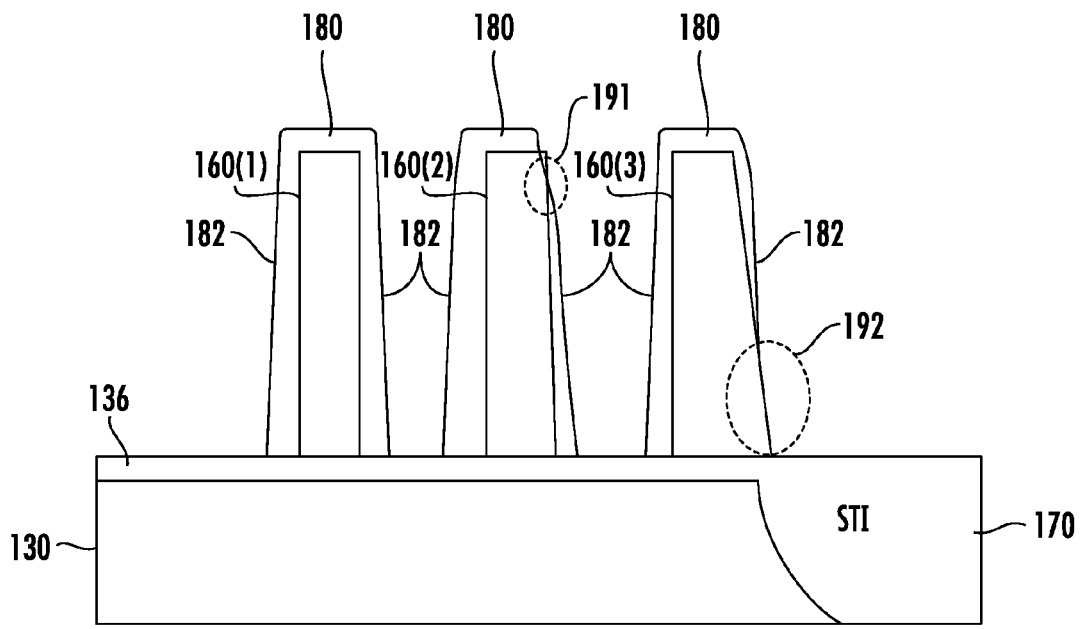

A first pair of sidewall spacers 182 are formed adjacent the gates 160(1)-160(3) as provided in FIG. 4. The first pair of sidewall spacers 182 entirely covers the sidewalls of the first gate 160(1) since the first gate does not have a tapered profile.

However, the first pair of sidewall spacers 182 do not entirely cover the sidewalls of the second and third gates 160(2) and 160(3) because of the tapered profile of the respective gates. The first pair of sidewall spacers 182 on the second gate 160(2) define an exposed tapered outer surface 191, as marked by a dashed oval in FIG. 4. Here, the exposed tapered outer surface 191 is at an upper portion of the gate 160(2). Similarly, the first pair of sidewall spacers 182 on the third gate 160(3) define an exposed tapered outer surface 192, as also marked by a dashed oval in FIG. 4. Here, the exposed tapered outer surface 192 is at a base of the gate 160(3).

Figure 5:
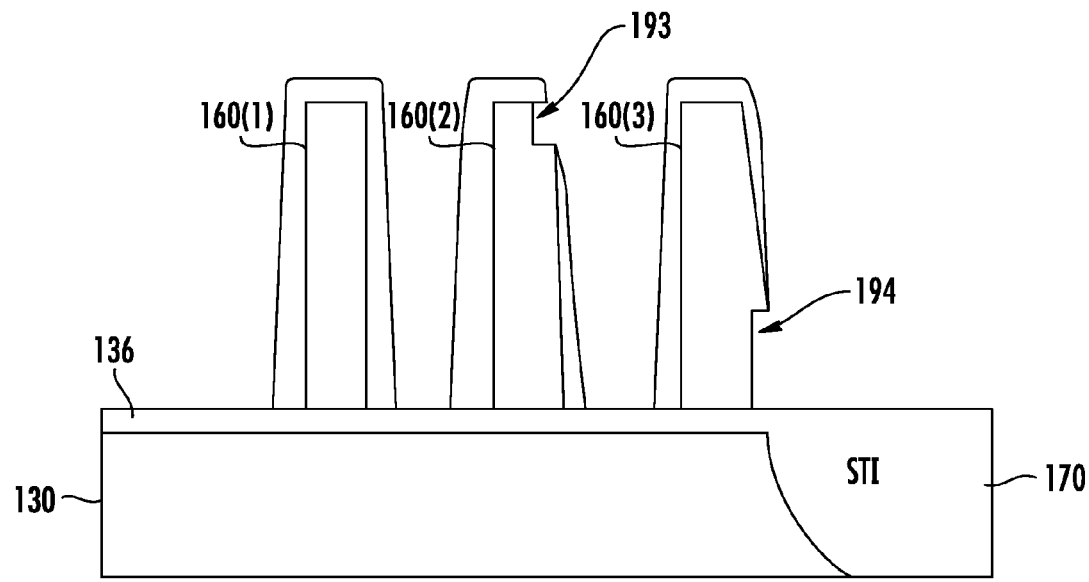
Figure 6:
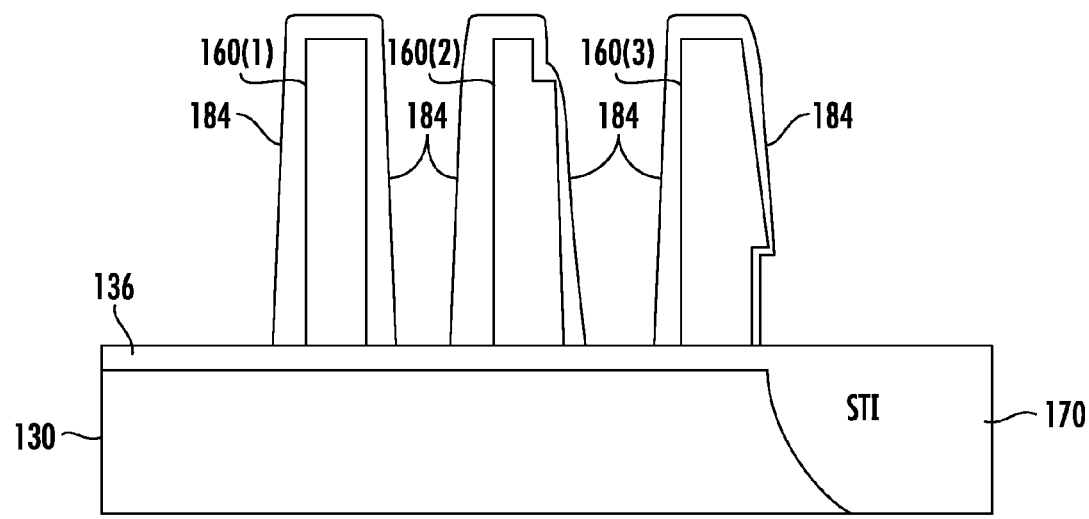

Referring now to FIG. 5, a portion of the second gate 160(2) is removed at the exposed tapered outer surface 191 to define a recess 193. Similarly, a portion of the third gate 160(3) is removed at the exposed tapered outer surface 192 to define a recess 194.

An isotropic etch is intentionally performed so that the recesses 193, 194 may be configured as notches in the exposed tapered outer surfaces. Each notch has horizontally oriented sidewalls, and a vertically oriented sidewall that connects with the horizontally oriented sidewalls. As illustrated in the figures, the notches 193, 194 have notch sidewalls based on right angle cuts into the sidewalls of the exposed tapered outer surfaces 191, 192. The first pair of sidewall spacers 182 remains intact while the notches 193, 194 are formed. The mask 180 also remains intact while the notches 193, 194 are formed.

A second pair of sidewall spacers 184 is formed to cover the first pair of sidewall spacers 182 and the recess 193 on the second gate 160(2). Similarly, a second pair of sidewall spacers 184 is formed to cover the first pair of sidewall spacers 182 and the recess 194 on the third gate 160(3). The second pair of sidewall spacers 184 advantageously cover the notches 193, 194.

The first pair of sidewall spacers 182 has a first thickness, and the second pair of sidewall spacers 184 has a second thickness. The first and second thicknesses are selected so that a combined thickness is sufficient to entirely cover the sidewall surfaces of the second and third gates 160(2), 160(3). Since the sidewall spacers 182, 184 have a tapered profile, the thickness is measured at its widest point, as readily appreciated by those skilled in the art.

In one embodiment, the first and second thicknesses of the first and second pair of sidewall spacers 182, 184 are equal. For example, if a combined thickness of the first and second pair of sidewall spacers 182, 184 is 8 nm, then each thickness is 4 nm, for example. In other embodiments, the first and second thicknesses of the first and second pair of sidewall spacers 182, 184 may be different form one another.

Now that the gates 160(1)-160(3) are no longer exposed, the source/drain regions 140 may be formed. The source/drain regions 140 are epitaxially grown, as readily understood buy those skilled in the art. The source/drain regions 140 may comprise epitaxially grown silicon or silicon germanium, for example. Since there is no exposure of the gates 160(1)-160(3) through either the hard mask 180 and/or through the first and second sidewall spacers 182, 184, this avoids the unwanted formation of spurious nodules on the gates 160(1)-160(3) during formation of the source/drain regions 140. The substrate may comprise a semiconductor substrate.

The gates 160(1)-160(3) are typically formed as dummy gates. Once the source/drain regions 140 are formed, then the dummy gates are removed so as to form the regular gates of the semiconductor device 120.

In one embodiment, the gates 160(1)-160(3) shown in FIGS. 3-6 may be a doped polysilicon gate material, for example. In another embodiment, the initial gate structure shown in FIGS. 3-6 may be a dummy gate for which later in the processing, at least part of the dummy gate material is removed and replaced with one or more other materials. The materials include, for example, one or more metal layers, one or more doped semiconductor material layers, one or more barrier layers, and combinations thereof, etc. This is often referred to as a replacement metal gate structure 160(1)-160(3), for example.

In some process flows, the replacement of the dummy gate is done after the formation of the source/drain regions, as noted above. Hence, the reliability of the process flow is advantageously improved by eliminating or at least reducing the number of undesired nodules being formed.

Figure 7:
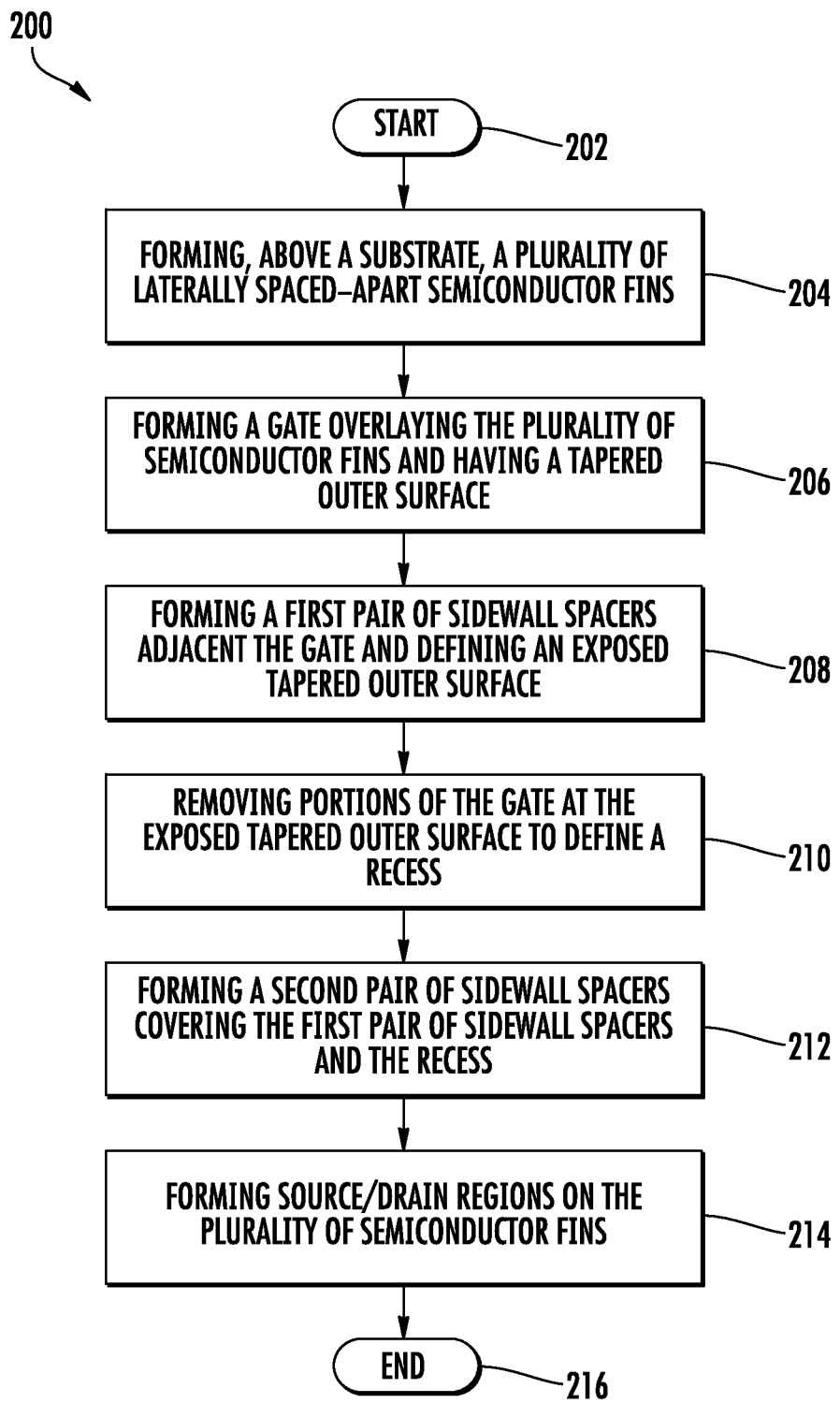
FIG. 7 is a flowchart illustrating a method of making the semiconductor FINFET device of FIG. 2.

Referring now to the flowchart 200 in FIG. 7, a method for making a semiconductor device 120 as described above will now be summarized. From the start (Block 202), the method comprises forming, above a substrate 130, a plurality of laterally spaced-apart semiconductor fins 134 at Block 204. A gate 160(3) is formed to overlie the plurality of semiconductor fins 134 and having a tapered outer surface 166 at Block

206. A first pair of sidewall spacers 182 is formed adjacent the gate 160(3) and defines an exposed tapered outer surface 192 at Block 208. The method further includes removing portions of the gate at the exposed tapered outer surface 192 to define a recess 194 at Block 210, and forming a second pair of sidewall spacers 184 covering the first pair of sidewall spacers 182 and the recess 194 at Block 212. Source/drain regions 140 are formed on the plurality of semiconductor fins 134 at Block 214. The method ends at Block 216.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming, above a substrate, a plurality of laterally spaced-apart semiconductor fins;
    forming a gate overlying the plurality of semiconductor fins and having a tapered outer surface;
    forming a first pair of sidewall spacers adjacent the gate and defining an exposed tapered outer surface;
    removing portions of the gate at the exposed tapered outer surface to define a recess;
    forming a second pair of sidewall spacers covering the first pair of sidewall spacers and the recess; and
    forming source/drain regions on the plurality of semiconductor fins.

2. The method according to claim 1 wherein the source/drain regions are epitaxially grown.

3. The method according to claim 1 further comprising leaving the first pair of sidewall spacers intact while the portions of the gate at the exposed tapered outer surface are removed.

4. The method according to claim 1 wherein the first pair of sidewall spacers has a first thickness, the second pair of sidewall spacers has a second thickness, and the first and second thicknesses are equal.

5. The method according to claim 1 further comprising forming a mask on an upper surface of the gate before forming the first pair of sidewall spacers.

6. The method according to claim 5 further comprising leaving the mask intact while the portions of the gate at the exposed tapered outer surface are removed.

7. The method according to claim 1 wherein the gate comprises a dummy gate.

8. The method according to claim 1 wherein the gate comprises a replacement metal gate.

9. The method according to claim 1 wherein the recess is at an upper portion of the gate.

10. The method according to claim 1 wherein the recess is at a lower portion of the gate.

11. The method according to claim 1 wherein the source/drain regions comprise epitaxially grown silicon.

12. The method according to claim 1 wherein the source/drain regions comprise epitaxially grown silicon germanium.

13. A method for making a semiconductor device comprising:
    forming, above a substrate, a plurality of laterally spaced-apart semiconductor fins;
    forming a gate overlying the plurality of semiconductor fins and having a tapered outer surface;
    forming a mask on an upper surface of the gate;
    forming a first pair of sidewall spacers adjacent the gate and defining an exposed tapered outer surface;
    removing portions of the gate at the exposed tapered outer surface to define a recess while the first pair of sidewall spacers and the mask remain intact;
    forming a second pair of sidewall spacers covering the first pair of sidewall spacers and the recess; and
    epitaxially forming source/drain regions on the plurality of semiconductor fins.

14. The method according to claim 13 wherein the first pair of sidewall spacers has a first thickness, the second pair of sidewall spacers has a second thickness, and the first and second thicknesses are equal.

15. The method according to claim 13 further comprising leaving the mask intact while the portions of the gate at the exposed tapered outer surface are removed.

16. The method according to claim 13 wherein the gate comprises a dummy gate.

17. The method according to claim 13 wherein the gate comprises a replacement metal gate.

18. A method for making a semiconductor device comprising:
    forming, above a substrate, a plurality of laterally spaced-apart semiconductor fins;
    forming a dummy gate overlying the plurality of semiconductor fins and having a tapered outer surface;
    forming a first pair of sidewall spacers adjacent the dummy gate and defining an exposed tapered outer surface;
    leaving the first pair of sidewall spacers intact while removing portions of the dummy gate at the exposed tapered outer surface to define a recess;
    forming a second pair of sidewall spacers covering the first pair of sidewall spacers and the recess; and
    forming source/drain regions on the plurality of semiconductor fins.

19. The method according to claim 18 wherein the first pair of sidewall spacers has a first thickness, the second pair of sidewall spacers has a second thickness, and the first and second thicknesses are equal.

20. The method according to claim 18 further comprising forming a mask on an upper surface of the dummy gate before forming the first pair of sidewall spacers.

21. The method according to claim 20 further comprising leaving the mask intact while the portions of the dummy gate at the exposed tapered outer surface are removed.

22. The method according to claim 18 wherein the source/drain regions comprise epitaxially grown silicon.

23. The method according to claim 18 wherein the source/drain regions comprise epitaxially grown silicon germanium.

* * * * *